United States Patent
Doyle et al.

(10) Patent No.: US 11,114,471 B2
(45) Date of Patent: Sep. 7, 2021

(54) THIN FILM TRANSISTORS HAVING RELATIVELY INCREASED WIDTH AND SHARED BITLINES

(71) Applicant: Intel Corporation, Santa Clara, CA (US)

(72) Inventors: Brian S. Doyle, Portland, OR (US); Abhishek A. Sharma, Hillsboro, OR (US); Ravi Pillarisetty, Portland, OR (US); Prashant Majhi, San Jose, CA (US); Elijah V. Karpov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/633,559

(22) PCT Filed: Sep. 26, 2017

(86) PCT No.: PCT/US2017/053424
§ 371 (c)(1),
(2) Date: Jan. 23, 2020

(87) PCT Pub. No.: WO2019/066774
PCT Pub. Date: Apr. 4, 2019

(65) Prior Publication Data
US 2020/0212075 A1 Jul. 2, 2020

(51) Int. Cl.
*H01L 27/00* (2006.01)
*H01L 29/00* (2006.01)
(Continued)

(52) U.S. Cl.
CPC ...... *H01L 27/1225* (2013.01); *H01L 21/0273* (2013.01); *H01L 21/76802* (2013.01);
(Continued)

(58) Field of Classification Search
CPC .......... H01L 21/0273; H01L 21/76802; H01L 21/7687; H01L 27/1225; H01L 27/1288;
(Continued)

(56) References Cited

U.S. PATENT DOCUMENTS 6,204,544 B1 3/2001 Wang et al.
6,413,802 B1 7/2002 Hu et al.
(Continued)

FOREIGN PATENT DOCUMENTS

| WO | WO-2011-101463 | 8/2011 |
|---|---|---|
| WO | WO-2018-236357 | 12/2018 |
| WO | WO-2019-066774 | 4/2019 |

OTHER PUBLICATIONS

International Preliminary Report on Patentability for International Patent Application No. PCT/US2017/053424 dated Apr. 9, 2020, 8 pgs.
(Continued)

*Primary Examiner* — Nikolay K Yushin
(74) *Attorney, Agent, or Firm* — Schwabe, Williamson & Wyatt P.C.

(57) ABSTRACT

Thin film transistors having relatively increased width and shared bitlines are described. In an example, an integrated circuit structure includes a plurality of transistors formed in an insulator structure above a substrate. The plurality of transistors arranged in a column such that the respective lateral arrangement of the source, the gate, and the drain of each of the transistors aligns with an adjacent thin film transistor, wherein the plurality transistors extend vertically through the insulator structure at least two interconnect levels to provide increased relative width. A first conductive contact is formed between one of sources and drains of at
(Continued)

least two of the plurality of transistors in the column, and the conductive contact extends through the insulator structure at least two interconnect levels.

25 Claims, 12 Drawing Sheets

(51) Int. Cl.
  *H01L 21/00* (2006.01)
  *H01L 27/12* (2006.01)
  *H01L 21/027* (2006.01)
  *H01L 21/768* (2006.01)
  *H01L 29/08* (2006.01)
  *H01L 29/417* (2006.01)
  *H01L 29/66* (2006.01)
  *H01L 29/786* (2006.01)

(52) U.S. Cl.
  CPC ...... *H01L 21/76877* (2013.01); *H01L 27/124* (2013.01); *H01L 27/1288* (2013.01); *H01L 29/0847* (2013.01); *H01L 29/41733* (2013.01); *H01L 29/66969* (2013.01); *H01L 29/7869* (2013.01)

(58) Field of Classification Search
  CPC ............... H01L 27/124; H01L 29/0847; H01L 29/66969; H01L 29/7869; H01L 29/78603; H01L 29/78696; H01L 29/41733; H01L 29/66787; H01L 29/785
  See application file for complete search history.

(56) References Cited

U.S. PATENT DOCUMENTS

2014/0124827 A1   5/2014   Holz et al.
2016/0372597 A1   12/2016  Rakshit et al.

OTHER PUBLICATIONS

International Search Report and Written Opinion for International Patent Application No. PCT/US2017/053424 dated May 17, 2018, 11 pgs.

THIN FILM TRANSISTORS HAVING RELATIVELY INCREASED WIDTH AND SHARED BITLINES

CROSS-REFERENCE TO RELATED APPLICATION

This patent application is a U.S. National Phase Application under 35 U.S.C. § 371 of International Application No. PCT/US2017/053424, filed Sep. 26, 2017, entitled "THIN FILM TRANSISTORS HAVING RELATIVELY INCREASED WIDTH AND SHARED BITLINES," which designates the United States of America, the entire disclosure of which is hereby incorporated by reference in its entirety and for all purposes.

TECHNICAL FIELD

Embodiments of the disclosure are in the field of integrated circuit structures and, in particular, thin film transistors having relatively increased width and shared bitlines.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller sub threshold swing enables the TFT to turn off to a lower leakage value when the gate-source voltage drops below the threshold voltage of the TFT. The conventional theoretical lower limit at room temperature for the sub threshold swing of the TFT is 60 millivolts per decade of change in the drain current.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
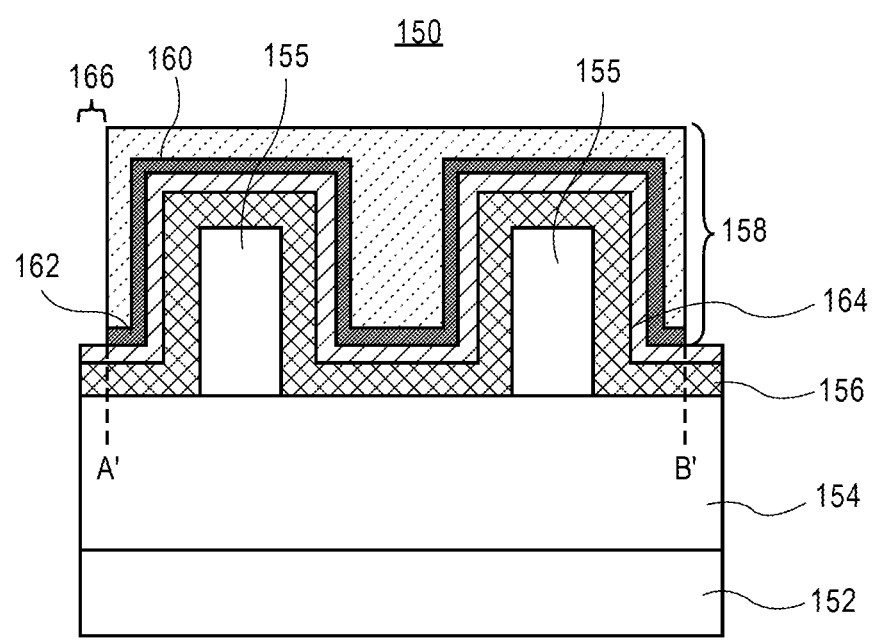
FIG. 1A illustrates a cross-sectional view taken along a gate "width" of a thin film integrated circuit structure having relatively increased width, in accordance with an embodiment of the present disclosure.

Thin film transistors having relatively increased width and shared bitlines are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating BEOL thin film transistors (TFTs) having relatively increased width relative to TFTs of conventional geometry, and shared bitlines. Embodiments may include or pertain to one or more of back end transistors, IGZO, semiconducting oxide materials, thin film transistors, and system-on-chip (SoC) technologies. One or more embodiments may be implemented to realize high performance backend transistors to potentially increase monolithic integration of backend logic plus memory in SoCs of future technology nodes.

To provide context, there is increased need for advanced SoCs to include monolithically integrated BEOL transistors for logic functionality at higher metal layers. Such BEOL transistors typically have a lower thermal budget than front end transistors due to increased thermal sensitivity of back-end materials. Also, the performance of such transistors may be severely hampered due to low channel mobility for BEOL-compatible channel materials such as IGZO (indium gallium zinc oxide).

In accordance with one or more embodiments described herein, non-planar BEOL-compatible thin film transistors (TFTs) are fabricated by effectively increasing the transistor width (and hence the drive strength and performance) for a given projected area. A TFT fabricated using such an architecture may exhibit an increase in gate control, stability, and performance of thin film transistors. Applications of such systems may include, but are not limited to, back end (BEOL) logic, memory, or analog applications. Embodiments described herein may include non-planar structures that effectively increase transistor width (relative to a planar device) by integrating the devices in unique architectures.

As a first example of a structure having relative increase in transistor width, FIG. 1A illustrates a cross-sectional view taken along a gate "width" of a thin film integrated circuit structure having relatively increased width, in accordance with an embodiment of the present disclosure.

The non-planar TFT 150 is formed above a substrate 152, e.g., on an insulating layer 154 above a substrate. A pair of dielectric fins 155 is on the insulating layer 154. The non-planar TFT 150 includes a semiconducting oxide material 156, or similarly suitable channel material. The semiconducting oxide material 156 is conformal with the pair of dielectric fins 155 and with exposed portions of the insulating layer 154 between the pair of dielectric fins 155. A gate electrode 158 is formed on a gate dielectric layer 164 formed on the semiconducting oxide material 156. The gate electrode 158 may include a fill material 160 on a workfunction layer 162, as is depicted. The gate electrode 158 may expose regions 166 of the semiconducting oxide material 156 and the gate dielectric layer 164, as is depicted. Alternatively, the semiconducting oxide material 156 and the gate dielectric layer 164 have a same lateral dimension as the gate electrode 158. It is to be appreciated that source/drain regions are into and out of the page of the view of FIG. 1B.

Figure 1B:
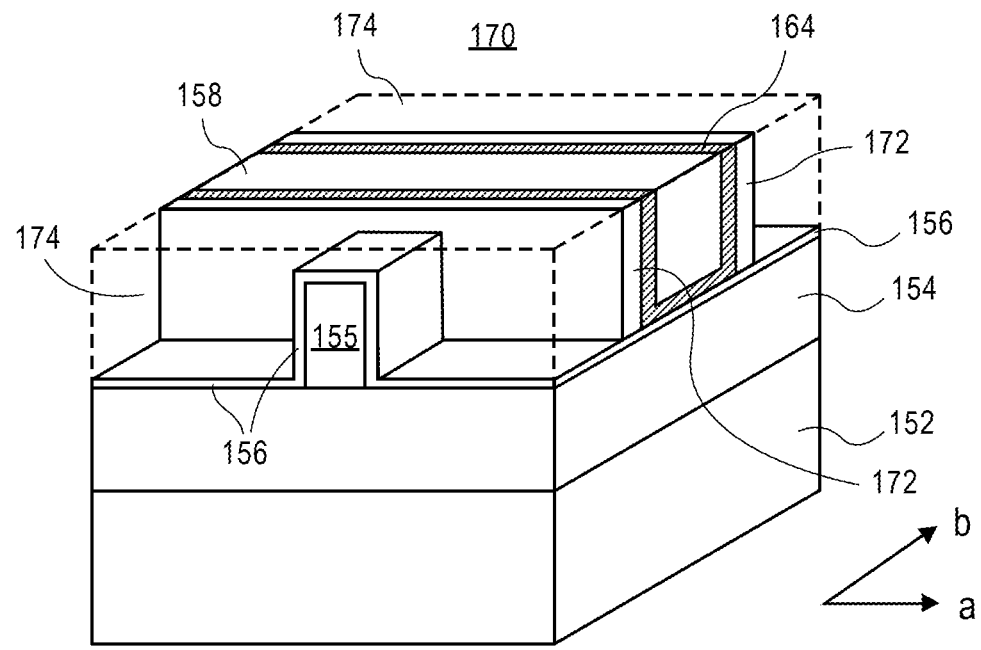
FIGS. 1B and 1C illustrate angled and direct cross-sectional views of a thin film integrated circuit structure having relatively increased width, in accordance with an embodiment of the present disclosure.

The non-planar TFT 150 has an effective gate width that is the length of the conformal semiconducting oxide material 156 between locations A' and B', i.e., the full length including undulating portions over the tops and sidewalls of the dielectric fins 155, as is depicted in FIG. 1B. The TFT 150 may be referred to herein as a non-planar BEOL field effect transistor (FET). In comparison to a conventional planar TFT, the structure of FIG. 1A highlights the advantage of a non-planar architecture to increase effective gate width, referred to herein as a relatively increased width.

Figure 1C:
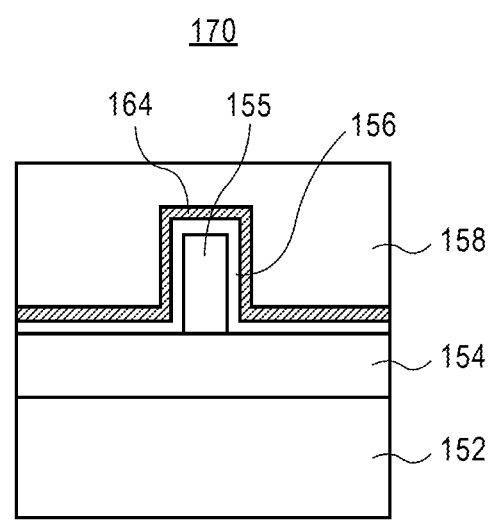

To highlight other aspects of a non-planar TFT topography, FIGS. 1B and 1C illustrate angled and direct cross-sectional views of a thin film integrated circuit structure having relatively increased width, in accordance with an embodiment of the present disclosure. It is to be appreciated that one dielectric fin is illustrated in FIGS. 1B and 1C for simplification. Embodiments may include a single device fabricated over one (FIGS. 1B and 1C), two (FIG. 1A) or more such dielectric fins.

Referring to FIGS. 1B and 1C, an integrated circuit structure 170 includes a dielectric fin 155 on an insulator layer 154 above a substrate 152. The insulator structure 155 has a topography that varies along a plane (ab) parallel with a global plane of the substrate 152. The dielectric fin 155 has a top and sidewalls. A semiconducting oxide material 156, or similarly suitable channel material, is on the top and sidewalls of the dielectric fin 155. A gate electrode 158 is over a first portion of the semiconducting oxide material 156 on the top and sidewalls of the dielectric fin 155. The gate electrode 158 has a first side opposite a second side. A first conductive contact (left 174) is adjacent the first side of the gate electrode 158, over a second portion of the semiconducting oxide material 156 on the top and sidewalls of the dielectric fin 155. A second conductive contact (right 174) is adjacent the second side of the gate electrode 158, over a third portion of the semiconducting oxide material 156 on the top and sidewalls of the dielectric fin 155.

In an embodiment, the integrated circuit structure 170 further includes a gate dielectric layer 164 between the gate electrode 158 and the first portion of the semiconducting oxide material 156 on the top and sidewalls of the dielectric fin 155, as is depicted in FIG. 1C. In an embodiment, the integrated circuit structure 170 further includes a first dielectric spacer (left 172) between the first conductive contact 174 and the first side of the gate electrode 158, the first dielectric spacer 172 over a fourth portion of the semiconducting oxide material 156 on the top and sidewalls of the dielectric fin 155 as is depicted in FIG. 1B. A second dielectric spacer (right 172) is between the second conductive contact 174 and the second side of the gate electrode 158, the second dielectric spacer 172 over a fifth portion of the second semiconducting oxide material 156 on the top and sidewalls of the dielectric fin 155, as is depicted in FIG. 1C. In one such embodiment, the gate dielectric layer 164 is further along the first and second dielectric spacers 172, as is also depicted in FIG. 1C.

In an embodiment, the insulator structure 155 (such as fin or fins 155) is composed of a dielectric material such as, but not limited to, silicon dioxide, silicon oxy-nitride, silicon nitride, or carbon-doped silicon nitride. In an embodiment, the insulator structure 155 is composed of a low-k dielectric material. In an embodiment, the gate dielectric layer 164 includes a layer of a high-k dielectric material directly on the semiconducting oxide material 156.

Figure 2:
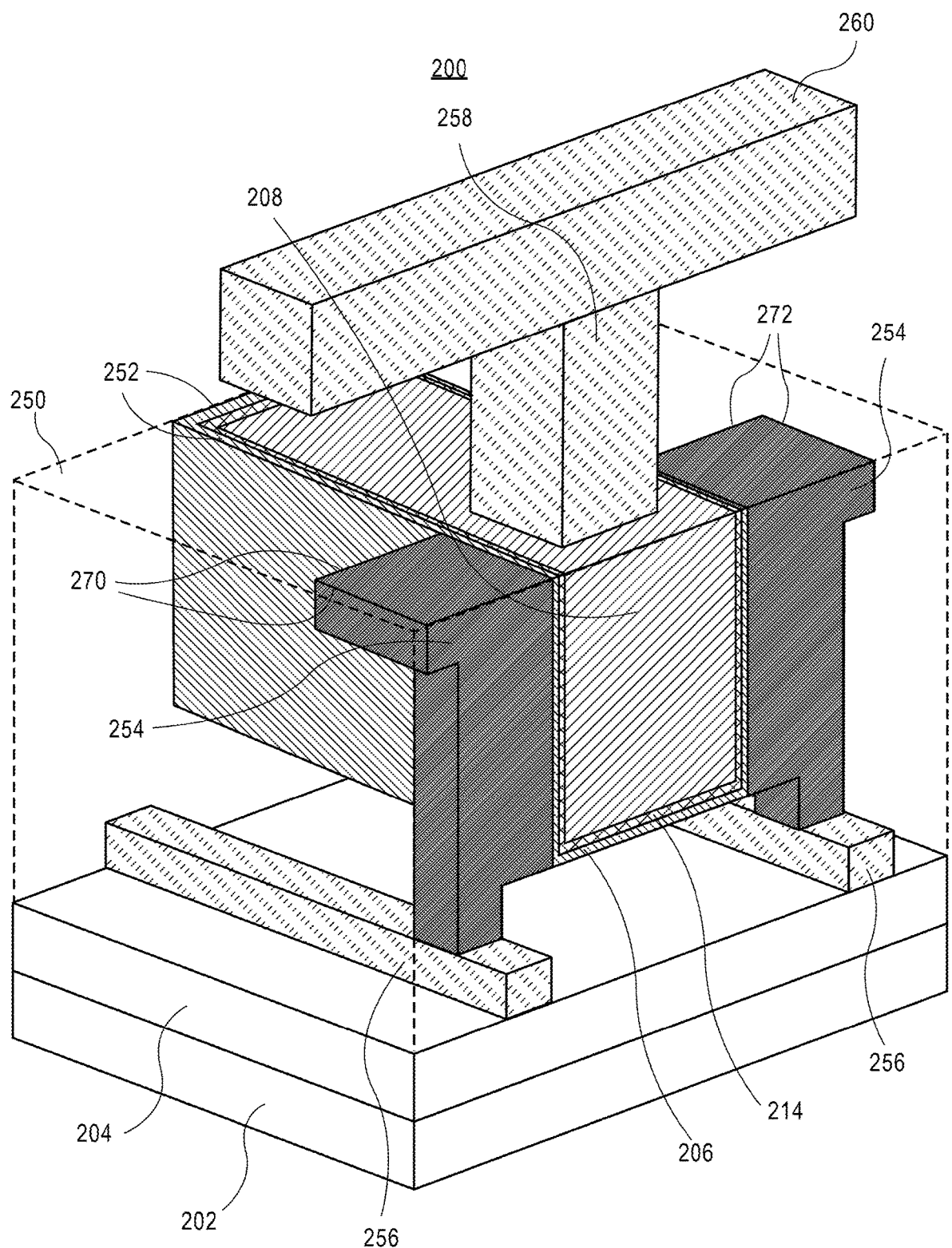
FIG. 2 illustrates an angled three-dimensional view of another thin film integrated circuit structure having relatively increased width, in accordance with another embodiment of the present disclosure.

As a second example of a structure having relative increase in transistor width, FIG. 2 illustrates an angled three-dimensional view of another thin film integrated circuit structure having relatively increased width, in accordance with another embodiment of the present disclosure.

Referring to FIG. 2, an integrated circuit structure 200 includes an insulator structure 250 above a substrate 202. The insulator structure 250 may be formed on an insulator layer 204, as is depicted. The insulator structure 250 has a first trench 252 therein, the first trench 252 having sidewalls and a bottom. A semiconducting oxide material 206, or similarly suitable channel material, is in the first trench 252 in the insulator structure 250. The semiconducting oxide material 206 is conformal with the sidewalls and bottom of the first trench 252. A gate dielectric layer 214 is on the semiconducting oxide material 206 in the first trench 252. The gate dielectric layer 214 is conformal with the semiconducting oxide material 206 conformal with the sidewalls and bottom of the first trench 252. A gate electrode 208 is on the gate dielectric layer 214 in the first trench 252. The gate electrode 208 has a first side opposite a second side and has an exposed top surface. A first conductive contact (left 254) is laterally adjacent the first side of the gate electrode 208. The first conductive contact (left 254) is on a first portion of the semiconducting oxide material 206 conformal with the sidewalls of the first trench 252. A second conductive contact (right 254) is laterally adjacent the second side of the gate electrode 208. The second conductive contact (right 254) is on a second portion of the semiconducting oxide material 206 conformal with the sidewalls of the first trench 252. It is to be appreciated that the conductive contacts 254 are shown only at the front portion of trench 252 for clarity of the drawing. In an embodiment, the conductive contacts 254 extend all the way, or substantially all the way along the trench 252 for maximized source/drain contact area and maintain a relatively small effective gate length.

In an embodiment, the insulator structure 250 is a single layer of ILD material, as is depicted. In another embodiment, the insulator structure 250 is a stack of alternating dielectric layers.

In an embodiment, a third conductive contact 258 is over and in contact with the exposed top surface of the gate electrode 208, as is depicted. In an embodiment, the first conductive contact (left 254) is in a second trench 270 in the insulator structure 250, and the third conductive contact (right 254) is in a third trench 272 in the insulator structure 250, as is depicted. In an embodiment, the third conductive contact 258 is coupled to a conductive line 260, which may be a word line, as is depicted. In an embodiment, the first and second conductive contacts 254 are coupled to corresponding conductive lines 256, which may correspond to source and drain lines in one embodiment.

In an embodiment, the semiconducting oxide material 206 includes indium gallium zinc oxide (IGZO). In an embodiment, the semiconducting oxide material 206 includes a material selected from the group consisting of tin oxide, antimony oxide, indium oxide, indium tin oxide, titanium oxide, zinc oxide, indium zinc oxide, gallium oxide, titanium oxynitride, ruthenium oxide and tungsten oxide. In an embodiment, the gate dielectric layer 214 includes a layer of a high-k dielectric material directly on the semiconducting oxide material 206. In an alternative embodiment, the channel material is not a semiconducting oxide material but is rather a layer of polycrystalline silicon.

In a further embodiment, the insulator structure may be a corrugated topography (not shown) that varies along a plane normal with a global plane of the substrate. In a specific such embodiment, the corrugated topography is within a single layer of ILD material. In another specific such embodiment, the corrugated topography is within an arrangement of alternating dielectric layers.

Figure 3A:
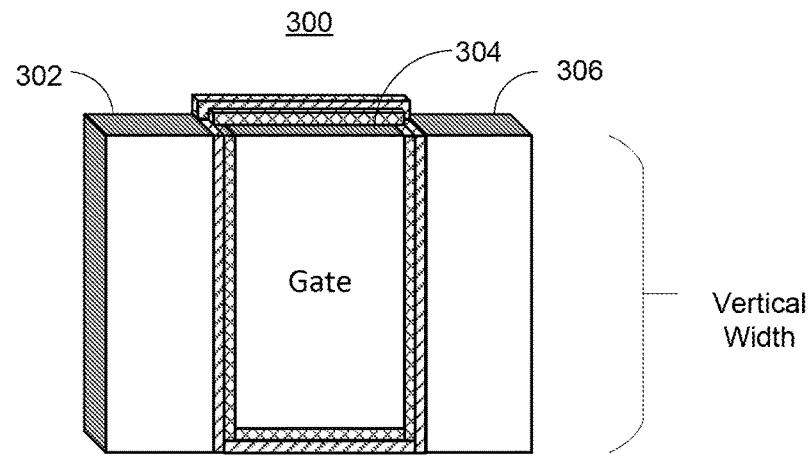
FIG. 3A is a three-dimensional view illustrating a lateral cross-section view of a TFT having a non-planar back-end FET architecture in accordance with the disclosed embodiments.

FIG. 3A is a three-dimensional view illustrating a lateral cross-section view of a TFT having a non-planar back-end FET architecture in accordance with the disclosed embodiments. Referring to both FIGS. 2 and 3A, a vertical length (depth) of the trench 252 is used to increase effective width of the transistor. That is, the depth of the trench 252 is the Z of the TFT, where the effective width (Weff) is relatively increased by setting Z to the depth of the trench. Accordingly, the example embodiments provide a vertical width field effect transistor (referred to herein as vertical width TFT) 300 having a lateral arrangement of a source 302, a gate 304, and a drain 306 with a relatively increased vertical length (depth).

Figure 3B:
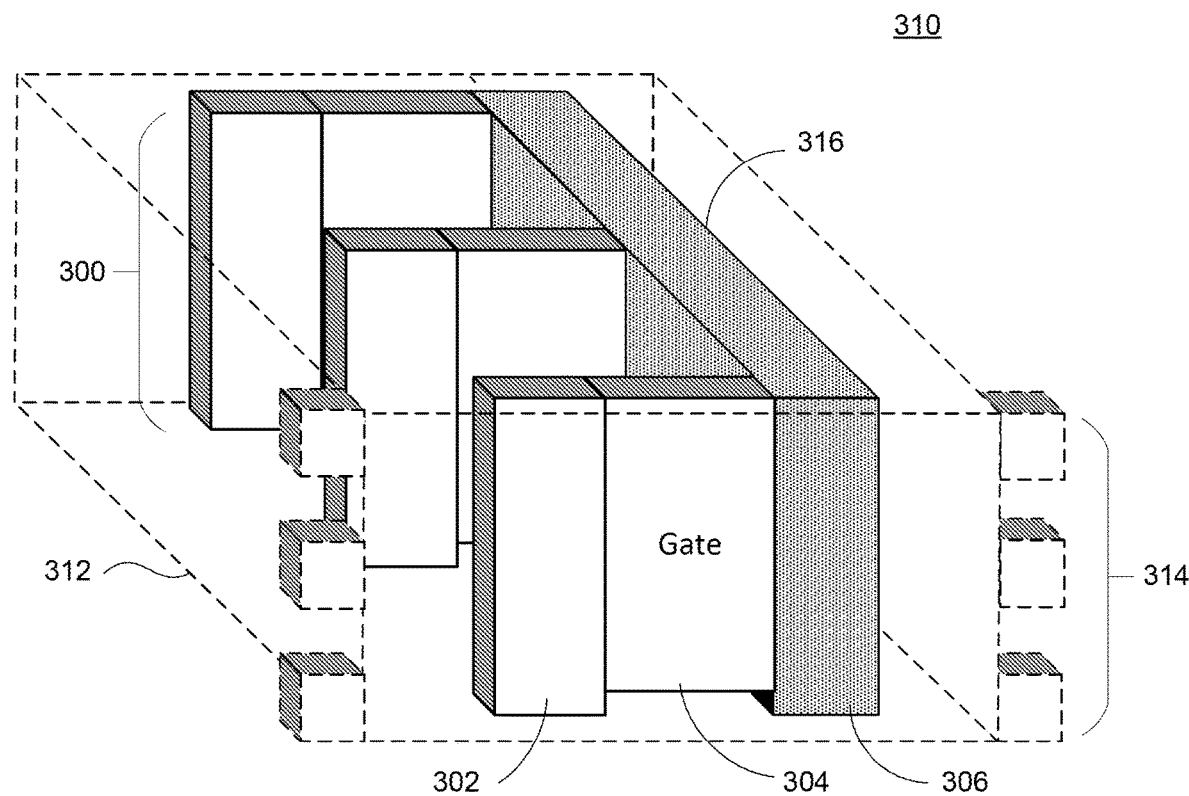
FIG. 3B is angled three-dimensional views illustrating a stack of adjacent vertical width TFTs.

FIG. 3B is angled three-dimensional views illustrating a stack of adjacent vertical width TFTs 300. According to a further embodiment of the disclosure, the vertical width TFTs 300 are repeated to provide an integrated circuit structure 310, such as a memory device or logic device. The integrated circuit structure 310 comprises a stack of a plurality of vertical width TFTs 300 formed in an insulator structure 312 above a substrate (not shown). Each of the vertical width TFTs 300 comprises a lateral arrangement in the insulating structure 312 of a gate 304, a source 302 laterally adjacent to a first side of the gate 304, and a drain 306 laterally adjacent to an opposite second side of the gate 304. The vertical width TFTs 300 are arranged in a column on the substrate such that the respective lateral arrangement of the source 302, the gate 304, and the drain 306 of each of the vertical width TFTs 300 aligns with an adjacent vertical width TFT 300.

According to one aspect of the embodiment, the vertical width TFTs 300 extend vertically through the insulator structure 312 at least two interconnect levels 314 to provide increased relative width. A conductive contact 316 is formed between at least one of the sources and the drains of at least two of the plurality of vertical width TFTs 300 in the column, and the conductive contact 316 also extends through the insulator structure 312 at least two interconnect levels 314. In one embodiment, a metal trench filled with a metal material forms the conductive contact 316. In one embodiment, at least one interconnect level may be made deeper (taller) than the others to accommodate the wider vertical width TFTs 300 device.

In the embodiment where the integrated circuit structure comprises a logic device, separate conductive contacts 316 may be formed between drains of respective pairs of the vertical width TFTs 300.

In the embodiment where the integrated circuit structure comprises a memory device, the conductive contact 316 is formed between the drains of all the vertical width TFTs in the column. In this embodiment, the conductive contact 316 comprises a bitline. Thus, a memory device is provided in which the drains 306 of each cell are connected together with one low-resistance bitline.

In yet another embodiment, the conductive contact 316 is formed between the sources 302 of at least two of the vertical width TFTs 300 in the column. In another embodiment, the conductive contact 316 is formed between the sources 302 of all of the vertical width TFTs 300 in the column.

In a further embodiment, a first conductive contact 316 is formed between the drains of the vertical width TFTs 300, and a second conductive contact (not shown) is formed between the sources 302 of the vertical width TFTs 300 in the column.

Figure 3C:
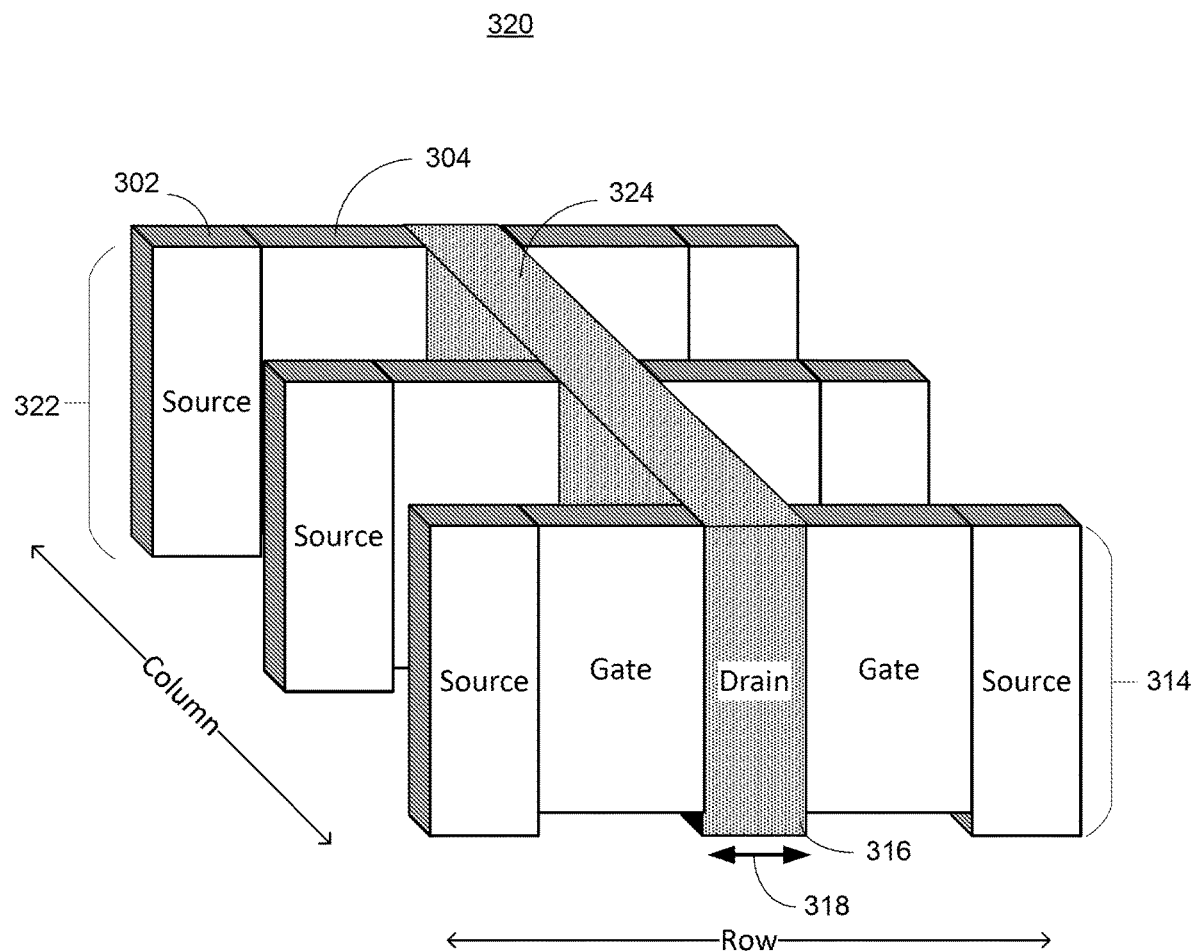
FIG. 3C is angled three-dimensional view illustrating an array of vertical width TFTs having a shared bitline.

FIG. 3C is angled three-dimensional view illustrating an array of vertical width TFTs having a shared bitline. According to a further embodiment of the disclosure, an integrated circuit structure 320 is provided comprising an array of vertical width TFTs 322 formed in an insulator structure (not shown).

As described above, each of the vertical width TFTs 322 comprise a lateral arrangement of: a gate 304, a source 302 laterally adjacent to a first side of the gate 304, and a drain 316 laterally adjacent to an opposite second side of the gate 304. In one embodiment, the array comprises rows of laterally adjacent vertical width TFTs 322, and columns of gate aligned vertical width TFTs 322 such that the respective lateral arrangement of the source, the gate, and the drain of each of the vertical width transistors aligns with an adjacent thin film transistor in the same column. The vertical width TFTs 322 extend vertically through an insulator structure at least two interconnect levels 314.

However, the array 320 includes single conductive contacts 324 that connect common drains 316 along respective columns of the array such that each of the single conductive contacts 324 are shared between neighboring pairs of vertical width TFTs 322 in each row of the array, thereby decreasing an area of the array by dispensing with the need for a separate drain for each vertical width TFT 322 in a pair. In the memory embodiment, this provides a bitline that is shared across rows of cells, which reduces the size of the memory as well as decreases resistance of the bitline. Furthermore, the conductive contact 324 or shared bitline extends a full width of the vertical width TFTs 322, where transistor width is now the depth of the gate 304 into the insulating structure 312. This depth into the interconnect system decreases the cross-sectional area of the bitline by having the vertical width TFTs 322 occupy several interconnect levels 314.

In yet a further aspect, in the embodiment where the conductive contact 316 is a bitline, the shared bitline is formed by a backbone trench in the insulating structure 312 that is filled with a metal material, as described further below. In one embodiment, the backbone trench may be made laterally wider (shown by line 318) to decrease bitline resistance.

Figure 4A:
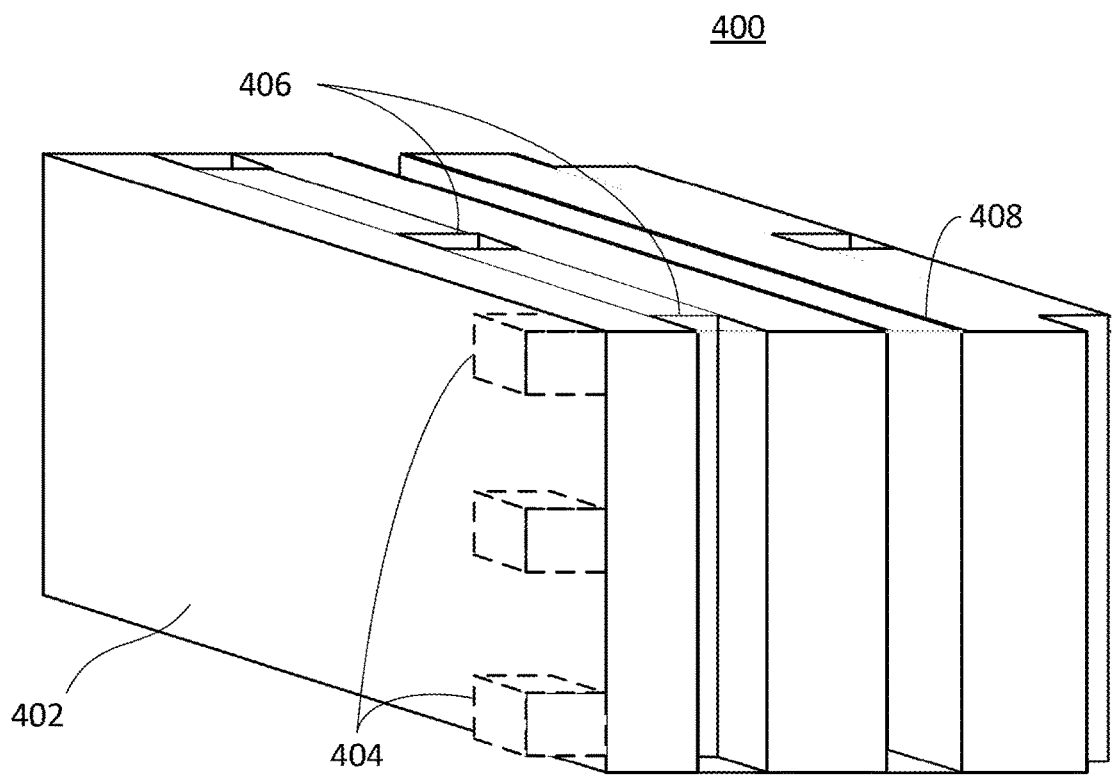
FIGS. 4A-4F illustrate cross-sectional views representing various operations in a method of fabricating an array of BEOL vertical width TFTs according to one embodiment.

FIGS. 4A-4E illustrate cross-sectional views representing various operations in a method of fabricating an array of BEOL vertical width TFTs according to one embodiment. FIG. 4A illustrates the array of BEOL vertical width TFTs 400 after an insulating structure 402 has been formed to a desired interconnect level 404 over conductive lines representing source and drain lines on a substrate (not shown). In the embodiment shown, the insulating structure 402 is deposited to a depth of two interconnect levels 404. Deep vias 406 and backbone trenches 408 have been formed through etching to the same interconnect level 404 in the insulating structure 402.

Figure 4B:
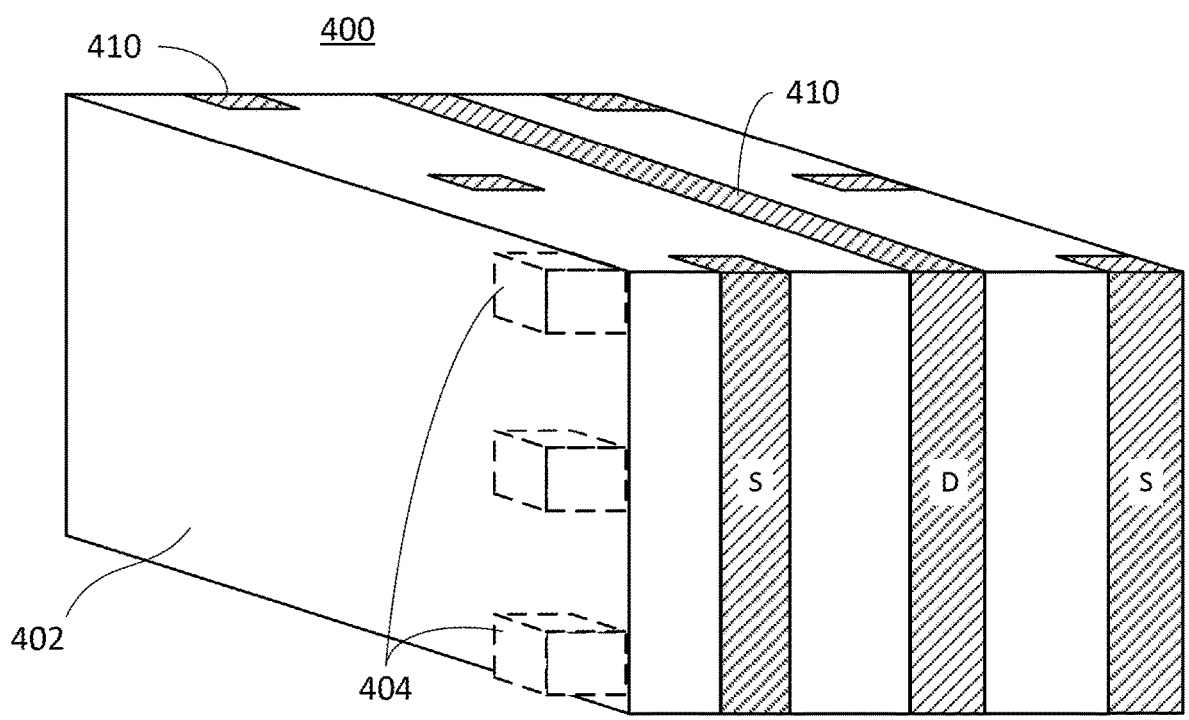

FIG. 4B illustrates the array of BEOL vertical width TFTs 400 after the deep vias 406 and backbone trenches 408 have been filled with conductive metal to form conductive contacts 410 representing source lines (S) and drain lines (D). In the embodiment shown, the conductive contacts 410 formed in the backbone trenches 408 span the columns of the array to form what will become shared bitlines.

Figure 4C:
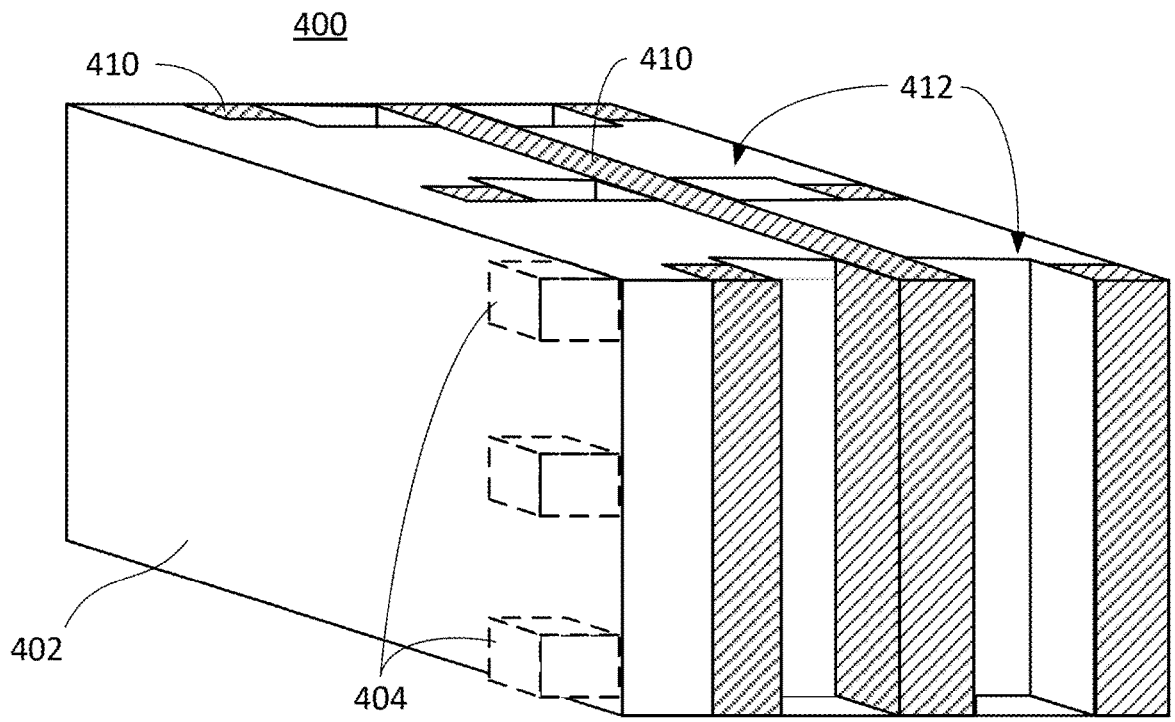

FIG. 4C illustrates the array of BEOL vertical width TFTs 400 after photoresist mask is deposited on top of the insulating structure 402 with openings defining locations of the channel areas between the source and drain lines, and the etching of the insulating structure 402 in those locations to the same interconnect level 404 as the insulating structure 402 to form channel area trenches 412.

Figure 4D:
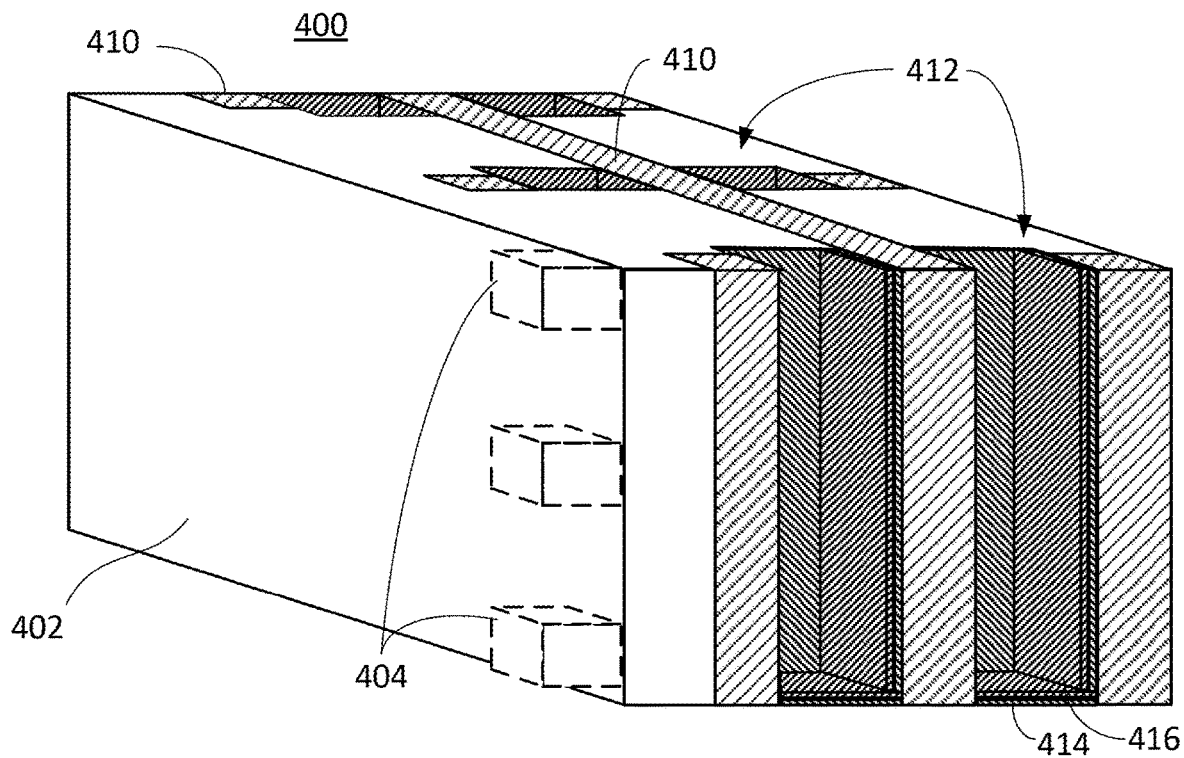

FIG. 4D illustrates the array of BEOL vertical width TFTs 400 after a semiconducting oxide material 414, or similarly suitable channel material, is formed in the channel area trenches 412 in the insulator structure 402. A gate dielectric layer 416 (e.g., a ferroelectric material for a memory device) is formed over the semiconducting oxide material 414 in the channel area trenches 412. Both the semiconducting oxide material 414 and the gate dielectric layer 416 are conformal with the sidewalls and bottom of the channel area trenches 412. In one embodiment, the semiconducting oxide material 414 and the gate dielectric layer 416 may be deposited using atomic layer deposition (ALD) processes.

Figure 4E:
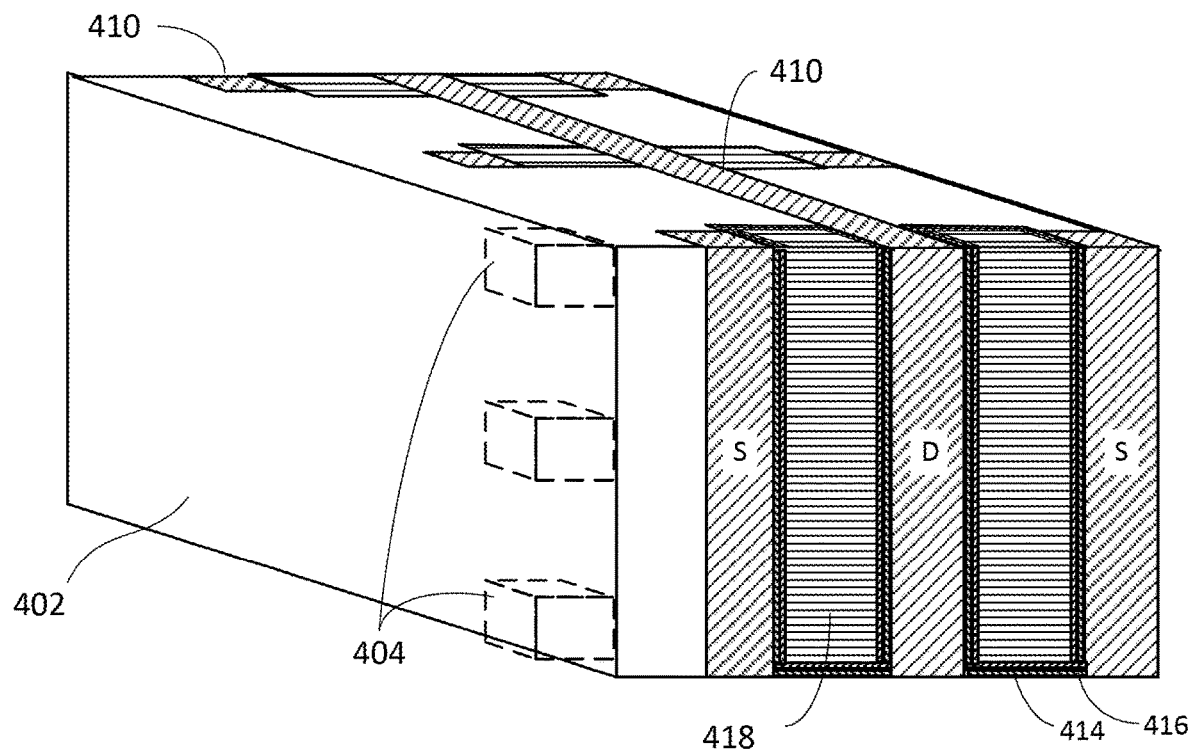

FIG. 4E illustrates the array of BEOL vertical width TFTs 400 after a gate electrode 418 is formed on the gate dielectric layer 416 to completely fill-in the channel area trenches 412 and effectively completing fabrication of the vertical width TFTs 400.

Figure 4F:
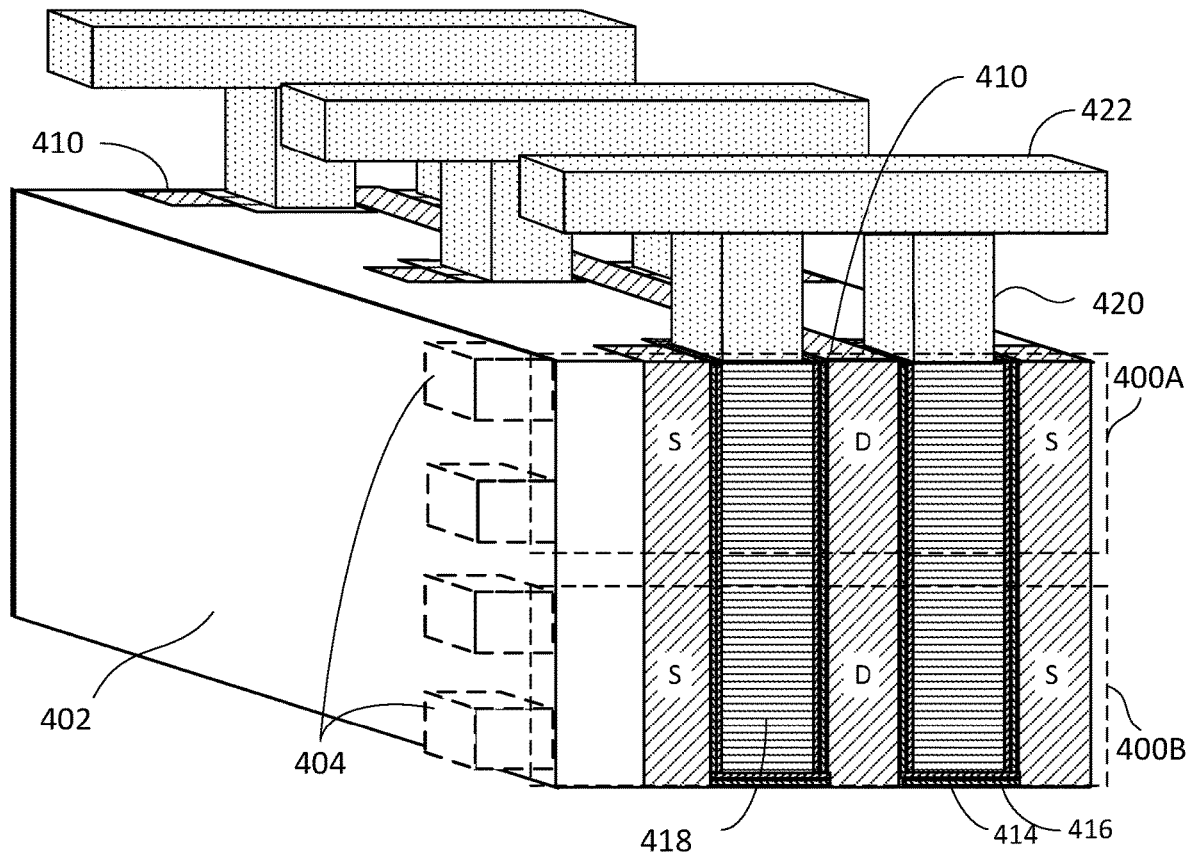

FIG. 4F illustrates the array of BEOL vertical width TFTs 400 after a last step of forming vias 420 on the gate electrodes 418 and forming wordlines 422 on the uppermost surface of the vias. As shown, the wordlines 422 are laid out perpendicular to the shared bitlines 410. According to aspects of the disclosed embodiments, more drive current and wider TFTs are achieved by extending the TFTs down additional interconnect levels 404. FIG. 4F also shows an embodiment where the array of BEOL vertical width TFTs 400 is shown with four interconnect levels 404, and two vertical width TFTs 400A and 400B extend vertically through the insulator structure at least two interconnect levels 404.

In another aspect, the integrated circuit structures described herein may be included in an electronic device. As a first example of an apparatus that may include one or more of the TFTs disclosed herein, FIGS. 5A and 5B are top views of a wafer and dies that include one or more thin film transistors having relatively increased width, in accordance with any of the embodiments disclosed herein.

Figure 5B:
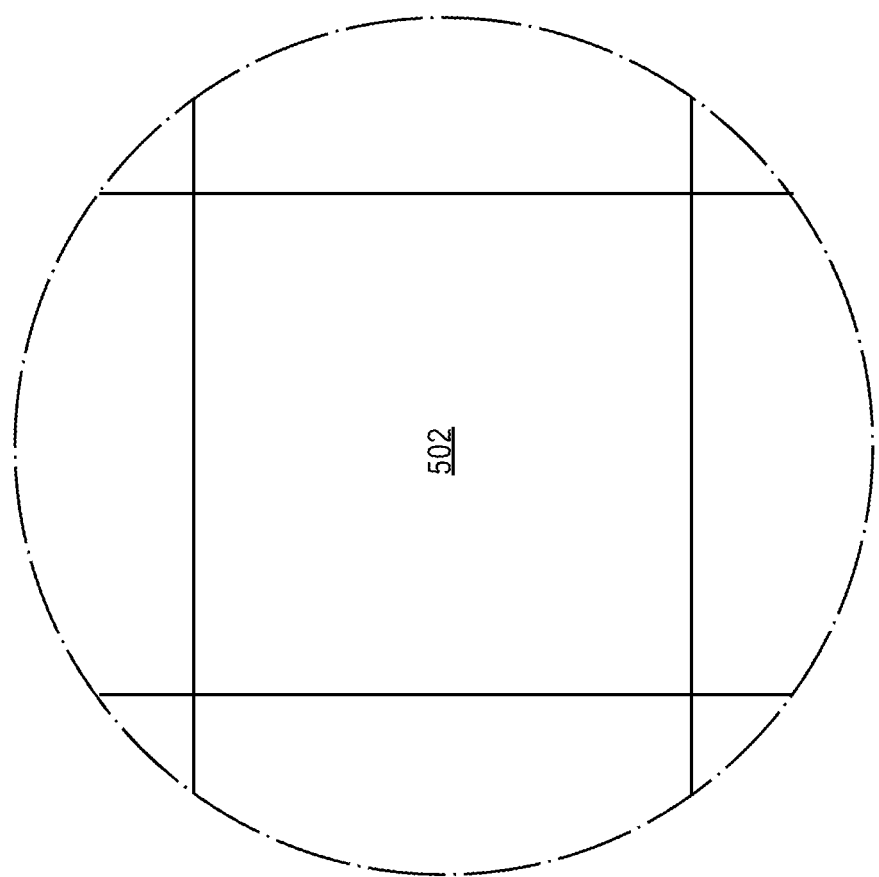
FIGS. 5A and 5B are top views of a wafer and dies that include one or more thin film transistors having relatively increased width, in accordance with one or more of the embodiments disclosed herein.
Figure 5A:
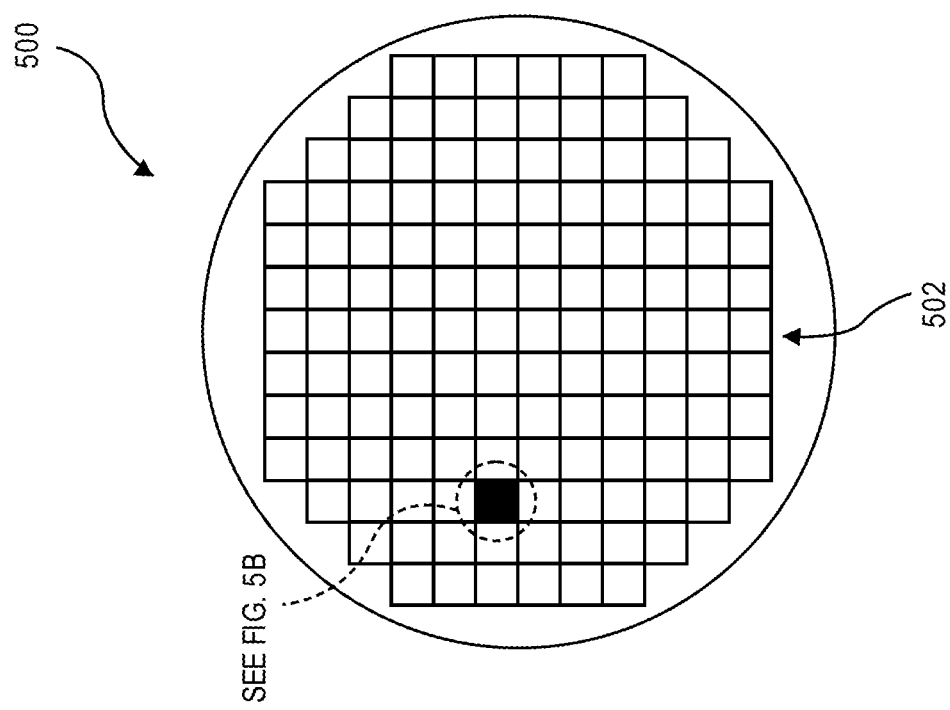

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more structures such as structures 150, 170, 200 or 300). After the fabrication of the semiconductor product is complete (e.g., after manufacture of structures 150, 170, 200 or 300), the wafer 500 may undergo a singulation process in which each of the dies 502 is separated from one another to provide discrete "chips" of the semiconductor product. In particular, devices that include TFT as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Figure 6:
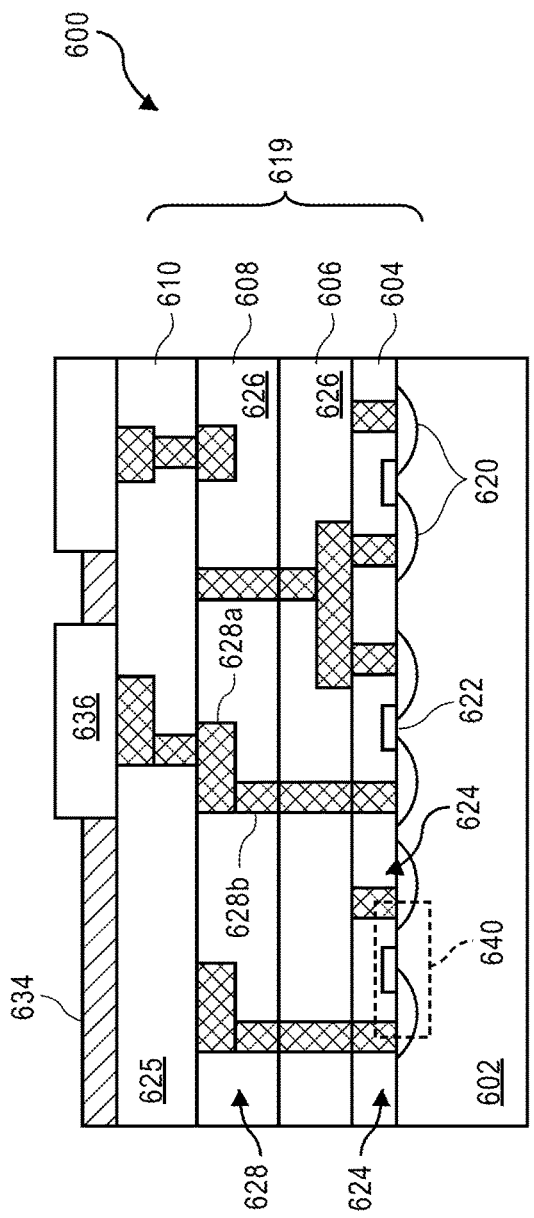
FIG. 6 is a cross-sectional side view of an integrated circuit (IC) device that may include one or more thin film transistors having relatively increased width, in accordance with one or more of the embodiments disclosed herein.

FIG. 6 is a cross-sectional side view of an integrated circuit (IC) device that may include one or more thin film transistors having relatively increased width, in accordance with one or more of the embodiments disclosed herein.

Referring to FIG. 6, an IC device 600 is formed on a substrate 602 (e.g., the wafer 500 of FIG. 5A) and may be included in a die (e.g., the die 502 of FIG. 5B), which may be singulated or included in a wafer. Although a few examples of materials from which the substrate 602 may be formed are described above in association with substrate 152, 202, 302 or 400, any material that may serve as a foundation for an IC device 600 may be used.

The IC device 600 may include one or more device layers, such as device layer 604, disposed on the substrate 602. The device layer 604 may include features of one or more transistors 640 (e.g., TFTs described above) formed on the substrate 602. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors. In particular, one or more of the transistors 640 take the form of the transistors 150, 170, 200 or 300. Thin-film transistors such as 100 or 300 may be particularly advantageous when used in the metal layers of a microprocessor device for analog circuitry, logic circuitry, or memory circuitry, and may be formed along with existing complementary metal oxide semiconductor (CMOS) processes.

Electrical signals, such as power and/or input/output (I/O) signals, may be routed to and/or from the transistors 640 of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form an interlayer dielectric (ILD) stack 619 of the IC device 600.

The interconnect structures 628 may be arranged within the interconnect layers 606-610 to route electrical signals according to a wide variety of designs (in particular, the arrangement is not limited to the particular configuration of interconnect structures 628 depicted in FIG. 6). Although a particular number of interconnect layers 606-610 is depicted in FIG. 6, embodiments of the present disclosure include IC devices having more or fewer interconnect layers than depicted.

In some embodiments, the interconnect structures 628 may include trench structures 628*a* (sometimes referred to as "lines") and/or via structures 628*b* filled with an electrically conductive material such as a metal. The trench structures 628*a* may be arranged to route electrical signals in a direction of a plane that is substantially parallel with a surface of the substrate 602 upon which the device layer 604 is formed. For example, the trench structures 628*a* may route electrical signals in a direction in and out of the page from the perspective of FIG. 6. The via structures 628*b* may be arranged to route electrical signals in a direction of a plane that is substantially perpendicular to the surface of the substrate 602 upon which the device layer 604 is formed. In some embodiments, the via structures 628*b* may electrically couple trench structures 628*a* of different interconnect layers 606-610 together.

The interconnect layers 606-610 may include a dielectric material 626 disposed between the interconnect structures 628, as shown in FIG. 6. In some embodiments, the dielectric material 626 disposed between the interconnect structures 628 in different ones of the interconnect layers 606-610 may have different compositions; in other embodiments, the composition of the dielectric material 626 between different interconnect layers 606-610 may be the same. In either case, such dielectric materials may be referred to as inter-layer dielectric (ILD) materials.

A first interconnect layer 606 (referred to as Metal 1 or "M1") may be formed directly on the device layer 604. In some embodiments, the first interconnect layer 606 may include trench structures 628*a* and/or via structures 628*b*, as shown. The trench structures 628*a* of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some embodiments, the second interconnect layer 608 may include via structures 628*b* to couple the trench structures 628*a* of the second interconnect layer 608 with the trench structures 628*a* of the first interconnect layer 606. Although the trench structures 628*a* and the via structures 628*b* are structurally delineated with a line within each interconnect layer (e.g., within the second interconnect layer 608) for the sake of clarity, the trench structures 628a and the via structures 628b may be structurally and/or materially contiguous (e.g., simultaneously filled during a dual-damascene process) in some embodiments.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606.

The IC device 600 may include a solder resist material 634 (e.g., polyimide or similar material) and one or more bond pads 636 formed on the interconnect layers 606-610. The bond pads 636 may be electrically coupled with the interconnect structures 628 and configured to route the electrical signals of the transistor(s) 640 to other external devices. For example, solder bonds may be formed on the one or more bond pads 636 to mechanically and/or electrically couple a chip including the IC device 600 with another component (e.g., a circuit board). The IC device 600 may have other alternative configurations to route the electrical signals from the interconnect layers 606-610 than depicted in other embodiments. For example, the bond pads 636 may be replaced by or may further include other analogous features (e.g., posts) that route the electrical signals to external components.

Figure 7:
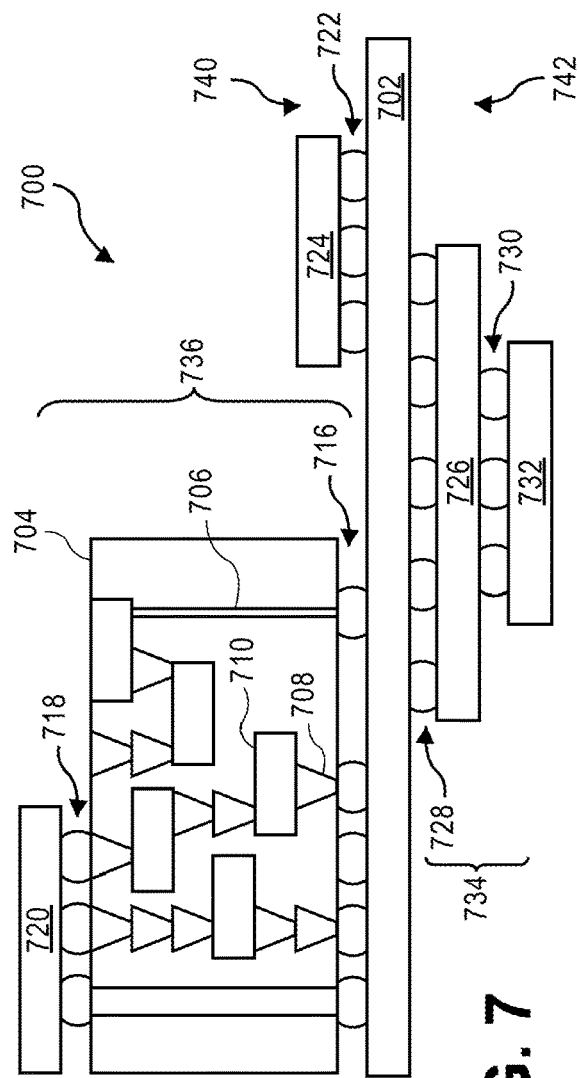
FIG. 7 is a cross-sectional side view of an integrated circuit (IC) device assembly that may include one or more thin film transistors having relatively increased width, in accordance with one or more of the embodiments disclosed herein.

FIG. 7 is a cross-sectional side view of an integrated circuit (IC) device assembly that may include one or more thin film transistors having relatively increased width, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of the TFT structures 150, 170, 200 or 300 disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 5B), an IC device (e.g., the IC device 600 of FIG. 6), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
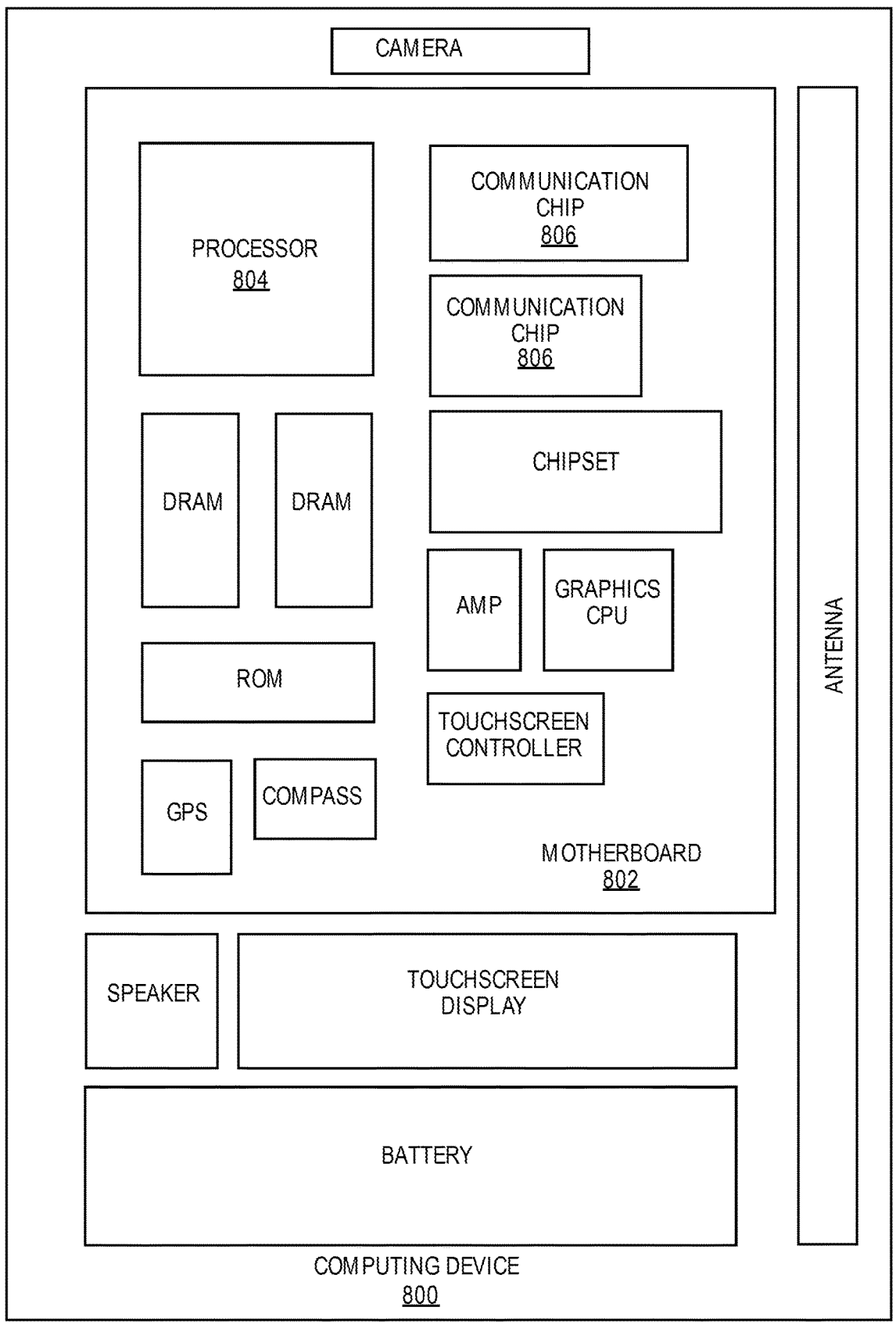
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more thin film transistors having relatively increased width, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more thin film transistors having relatively increased width, in accordance with implementations of embodiments of the disclosure.

In further implementations, another component housed within the computing device 800 may contain an integrated circuit die that includes one or more thin film transistors having relatively increased width, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein include thin film transistors having relatively increased width. The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a plurality of transistors formed in an insulator structure above a substrate, each comprising a lateral arrangement of: a gate in the insulating structure, a source laterally adjacent to a first side of the gate, and a drain laterally adjacent to an opposite a second side of the gate. The plurality of transistors arranged in a column such that the respective lateral arrangement of the source, the gate, and the drain of each of the transistors aligns with an adjacent thin film transistor, wherein the plurality transistors extend vertically through the insulator structure at least two interconnect levels to provide increased relative width. A first conductive contact is formed between one of sources and drains of at least two of the plurality of transistors in the column, and the conductive contact extends through the insulator structure at least two interconnect levels.

Example Embodiment 2

The integrated circuit structure of example embodiment 1, wherein the first conductive contact is formed between the drains of one or more pairs of the transistors in the column.

Example Embodiment 3

The integrated circuit structure of example embodiment 1 or 2, wherein the first conductive contact is formed between the drains of all the transistors in the column.

Example Embodiment 4

The integrated circuit structure of example embodiment 1 or 2, wherein the first conductive contact comprises a bitline.

Example Embodiment 5

The integrated circuit structure of example embodiment 1, wherein the first conductive contact is formed between sources of the at least two of the plurality of transistors in the column.

Example Embodiment 6

The integrated circuit structure of example embodiment 5, wherein the first conductive contact is formed between the sources of all of the plurality of transistors in the column.

Example Embodiment 7

The integrated circuit structure of example embodiment 1, wherein the first conductive contact is formed between the drains of the transistors and a second contact is formed between the sources of the transistors in the column.

Example Embodiment 8

The integrated circuit structure of example embodiment 1, 2, or 3, further comprising an array of transistors in which laterally adjacent transistors in each row of the array share a common drain.

Example Embodiment 9

The integrated circuit structure of example embodiment 8, wherein common drains along a same column of the array are connected together by the first conductive contact, providing a shared bitline.

Example Embodiment 10

The integrated circuit structure of example embodiment 8, wherein the shared bitline extends a full width of the transistors.

Example Embodiment 11

The integrated circuit structure of example embodiment 8 or 9, wherein the shared bitline is formed by a backbone trench in the insulating structure filled with a metal material.

Example Embodiment 12

The integrated circuit structure of example embodiment 11, wherein the backbone trench is made laterally wider to decrease bitline resistance.

Example Embodiment 13

The integrated circuit structure of example embodiment 1, 2, 5, 6, 7, 9, 10, 11, or 12, further comprising a semiconducting oxide material on the insulator structure, the semiconducting oxide material conformal with the topography of the insulator structure.

Example Embodiment 14

The integrated circuit structure of example embodiment 13, wherein further comprising a gate electrode over a first portion of the semiconducting oxide material on the insulator structure.

Example Embodiment 15

An integrated circuit structure includes an array of transistors formed in an insulator structure above a substrate. Each of the transistors comprises a lateral arrangement of: a gate in the insulating structure, a source laterally adjacent to a first side of the gate, and a drain laterally adjacent to an opposite a second side of the gate. The array of transistors is arranged in rows of laterally adjacent transistors, and columns such that the respective lateral arrangement of the source, the gate, and the drain of each of the transistors aligns with an adjacent thin film transistor in a same column. The plurality transistors extend vertically through the insulator structure at least two interconnect levels to provide increased relative width. First conductive contacts connect the drains along respective columns of the array such that each of the single conductive contacts are shared between neighboring pairs of transistors in each row of the array, and wherein the first conductive contact extends through the insulator structure at least two interconnect levels.

Example Embodiment 16

The integrated circuit structure of example embodiment 15, wherein the first conductive contacts comprise shared bitlines.

Example Embodiment 17

The integrated circuit structure of example embodiment 16, wherein the shared bitlines extend into the insulator structure a full width of the transistors.

Example Embodiment 18

The integrated circuit structure of example embodiment 15, 16, or 17, wherein the shared bitlines are formed by a backbone trench in the insulating structure filled with a metal material.

Example Embodiment 19

The integrated circuit structure of example embodiment 18 wherein the backbone trench is made laterally wider to decrease bitline resistance.

Example Embodiment 20

The integrated circuit structure of example embodiment 15, 16, 17, 18, or 19, further comprising second conductive contacts formed between sources of the at least two transistors in each of the columns.

Example Embodiment 21

The integrated circuit structure of example embodiment 20, wherein the second conductive contacts are formed between the sources of all of the plurality of transistors in the column.

Example Embodiment 22

The integrated circuit structure of example embodiment 15, 16, 17, 18, 19, or 21, further comprising a semiconducting oxide material on the insulator structure, the semiconducting oxide material conformal with the topography of the insulator structure.

Example Embodiment 23

The integrated circuit structure of example embodiment 22, further comprising a gate electrode over a first portion of the semiconducting oxide material on the insulator structure.

Example Embodiment 24

A method of fabricating an array of thin film transistors includes forming an insulating structure over a substrate to a desired interconnect level over conductive lines representing source and drain lines on a substrate. Vias and backbone trenches are formed in the insulating structure. The vias and backbone trenches are filled with conductive metal to form conductive contacts representing source lines and drain lines, wherein the conductive contacts formed in the backbone trenches span columns of the array to form shared bitlines. A photoresist mask is formed on top of the insulating structure with openings defining locations of channel areas between the source and drain lines. Channel area trenches are formed by etching the insulating structure in the locations defining the channel areas to a same interconnect level as the insulating. A semiconducting oxide material is formed in the channel trench areas. A gate dielectric layer is formed over the semiconducting oxide material in the channel area trenches. A gate electrode is formed on the gate dielectric layer to fill-in the channel trench areas. Vias are formed on the gate electrode. Wordlines are formed on an uppermost surface of the vias, wherein the wordlines are laid out perpendicular to the shared bitlines.

Example Embodiment 25

The method of fabricating an array of thin film transistors of example embodiment 23, further comprising forming vias and backbone trenches to a same interconnect level as the insulating structure.

What is claimed is:

1. An integrated circuit structure, comprising:
    a plurality of transistors formed in an insulator structure above a substrate, each comprising a lateral arrangement of:
        a gate in the insulating structure, a source laterally adjacent to a first side of the gate, and a drain laterally adjacent to an opposite a second side of the gate, the plurality of transistors arranged in a column such that the respective lateral arrangement of the source, the gate, and the drain of each of the transistors aligns with an adjacent thin film transistor, wherein the plurality transistors extend vertically through the insulator structure at least two interconnect levels to provide increased relative width; and a first conductive contact formed between one of sources and drains of at least two of the plurality of transistors in the column, and the conductive contact extends through the insulator structure at least two interconnect levels.

2. The integrated circuit structure of claim 1, wherein the first conductive contact is formed between the drains of one or more pairs of the transistors in the column.

3. The integrated circuit structure of claim 2, wherein the first conductive contact is formed between the drains of all the transistors in the column.

4. The integrated circuit structure of claim 2, wherein the first conductive contact comprises a bitline.

5. The integrated circuit structure of claim 1, wherein the first conductive contact is formed between sources of the at least two of the plurality of transistors in the column.

6. The integrated circuit structure of claim 5, wherein the first conductive contact is formed between the sources of all of the plurality of transistors in the column.

7. The integrated circuit structure of claim 1, wherein the first conductive contact is formed between the drains of the transistors and a second contact is formed between the sources of the transistors in the column.

8. The integrated circuit structure of claim 1, further comprising an array of transistors in which laterally adjacent transistors in each row of the array share a common drain.

9. The integrated circuit structure of claim 8, wherein common drains along a same column of the array are connected together by the first conductive contact, providing a shared bitline.

10. The integrated circuit structure of claim 8, wherein the shared bitline extends a full width of the transistors.

11. The integrated circuit structure of claim 8, wherein the shared bitline is formed by a backbone trench in the insulating structure filled with a metal material.

12. The integrated circuit structure of claim 8, wherein the backbone trench is made laterally wider to decrease bitline resistance.

13. The integrated circuit structure of claim 1, further comprising a semiconducting oxide material on the insulator structure, the semiconducting oxide material conformal with the topography of the insulator structure.

14. The integrated circuit structure of claim 13, further comprising a gate electrode over a first portion of the semiconducting oxide material on the insulator structure.

15. An integrated circuit structure, comprising:
    an array of transistors formed in an insulator structure above a substrate, wherein each of the transistors comprises a lateral arrangement of:
        a gate in the insulating structure, a source laterally adjacent to a first side of the gate, and a drain laterally adjacent to an opposite a second side of the gate, the array of transistors arranged in rows of laterally adjacent transistors, and columns such that the respective lateral arrangement of the source, the gate, and the drain of each of the transistors aligns with an adjacent thin film transistor in a same column, wherein the plurality transistors extend vertically through the insulator structure at least two interconnect levels to provide increased relative width; and
    first conductive contacts that connect the drains along respective columns of the array such that each of the single conductive contacts are shared between neighboring pairs of transistors in each row of the array, and wherein the first conductive contact extends through the insulator structure at least two interconnect levels.

16. The integrated circuit structure of claim 15, wherein the first conductive contacts comprise shared bitlines.

17. The integrated circuit structure of claim 16, wherein the shared bitlines extend into the insulator structure a full width of the transistors.

18. The integrated circuit structure of claim 15, wherein the shared bitlines are formed by a backbone trench in the insulating structure filled with a metal material.

19. The integrated circuit structure of claim 15, wherein the backbone trench is made laterally wider to decrease bitline resistance.

20. The integrated circuit structure of claim 15, further comprising second conductive contacts formed between sources of the at least two transistors in each of the columns.

21. The integrated circuit structure of claim 20, wherein the second conductive contacts are formed between the sources of all of the plurality of transistors in the column.

22. The integrated circuit structure of claim 15, further comprising a semiconducting oxide material on the insulator structure, the semiconducting oxide material conformal with the topography of the insulator structure.

23. The integrated circuit structure of claim 22, further comprising a gate electrode over a first portion of the semiconducting oxide material on the insulator structure.

24. A method of fabricating an array of thin film transistors, the method comprising:

forming an insulating structure over a substrate to a desired interconnect level over conductive lines representing source and drain lines on a substrate;

forming vias and backbone trenches in the insulating structure;

filling the vias and backbone trenches with conductive metal to form conductive contacts representing source lines and drain lines, wherein the conductive contacts formed in the backbone trenches span columns of the array to form shared bitlines;

forming a photoresist mask on top of the insulating structure with openings defining locations of channel areas between the source and drain lines;

forming channel area trenches by etching the insulating structure in the locations defining the channel areas to a same interconnect level as the insulating;

forming a semiconducting oxide material in the channel trench areas;

forming a gate dielectric layer over the semiconducting oxide material in the channel area trenches;

forming a gate electrode on the gate dielectric layer to fill-in the channel trench areas forming vias on the gate electrode; and forming wordlines on an uppermost surface of the vias, wherein the wordlines are laid out perpendicular to the shared bitlines.

25. The method of claim 24, further comprising forming vias and backbone trenches to a same interconnect level as the insulating structure.

* * * * *